United States Patent
Rangachari et al.

(10) Patent No.: US 10,812,091 B2
(45) Date of Patent: Oct. 20, 2020

(54) DITHERED M BY N CLOCK DIVIDERS

(71) Applicant: TEXAS INSTRUMENTS INCORPORATED, Dallas, TX (US)

(72) Inventors: Sundarrajan Rangachari, Bengaluru (IN); Sriram Murali, Bengaluru (IN); Sanjay Pennam, Visakhapatnam (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/837,537

(22) Filed: Apr. 1, 2020

(65) Prior Publication Data

US 2020/0228126 A1 Jul. 16, 2020

Related U.S. Application Data

(62) Division of application No. 16/269,473, filed on Feb. 6, 2019, now Pat. No. 10,651,863.

(60) Provisional application No. 62/786,099, filed on Dec. 28, 2018.

(30) Foreign Application Priority Data

Nov. 20, 2018 (IN) .............................. 201841043950

(51) Int. Cl.
*H03L 7/197* (2006.01)
*G06F 7/58* (2006.01)
*H03K 3/84* (2006.01)
*H03K 21/10* (2006.01)
*H03K 21/02* (2006.01)

(52) U.S. Cl.
CPC ............ *H03L 7/1974* (2013.01); *G06F 7/588* (2013.01); *H03K 3/84* (2013.01); *H03K 21/026* (2013.01); *H03K 21/10* (2013.01)

(58) Field of Classification Search
CPC ...... H03L 7/1974; H03K 3/84; H03K 21/026; H03K 21/10; G06F 7/588
USPC .................. 327/133, 114, 115, 116, 117
See application file for complete search history.

(56) References Cited

U.S. PATENT DOCUMENTS

2016/0179472 A1 6/2016 Sugahara

*Primary Examiner* — John W Poos
(74) *Attorney, Agent, or Firm* — John R. Pesetto; Charles A. Brill; Frank D. Cimino

(57) ABSTRACT

A method for dithering a fractional clock divider includes generating a first clock enable sequence based on a seed pattern of M ones and N minus M zeros, selecting a cyclic rotation of the seed pattern after N input clock cycles, and generating a second clock enable sequence based on the cyclic rotation. A clock gate receives the input clock signal and the clock enable sequences and outputs M clock cycles for every N input clock cycles. A random number generator indicates the cyclic rotation of the seed pattern. The seed pattern can be replaced with an updated seed pattern of M ones and N minus M zeros in a different order. In some examples, the clock enable sequence is generated using a cyclic shift register containing the seed pattern and a multiplexor. In other examples, the clock enable sequence is generated using a modulo N counter and a comparator.

6 Claims, 7 Drawing Sheets

DITHERED M BY N CLOCK DIVIDERS

CROSS-REFERENCE TO RELATED APPLICATIONS

This divisional application claims priority to U.S. patent application Ser. No. 16/269,473, filed Feb. 6, 2019, which application claims priority to India Provisional Application No. 201841043950, filed Nov. 20, 2018, and U.S. Provisional Application No. 62/786,099 filed Dec. 28, 2018, all of which are hereby incorporated by reference in their entirety.

BACKGROUND

Multifunctional integrated circuits (ICs) often combine analog and digital circuits and signals, requiring the IC to support multiple sampling rates. In the example of a wireless transceiver circuit, a digital signal chain receives a signal through the analog front-end circuit, which is converted to a digital signal by an analog-to-digital converter (ADC) at a first sampling rate. The digital signal is then processed by downstream filters in a decimation chain which operate at a second sampling rate that is a fraction of the first sampling rate. In another example, interpolation stages in an interpolation chain in the wireless transceiver circuit operate at a third sampling rate that is a fraction of a fourth sampling rate corresponding to a digital-to-analog converter (DAC). Some ICs support multiple ADC and DAC sampling rates and multiple interface rates within the same IC, such that multiple clock frequencies are needed. The different sampling rates and corresponding clock frequencies can result in coupling spurs due to digital activity coupling to analog activity and introducing artifacts such as sampling clock jitter, which in turn degrade the spurious free dynamic range (SFDR) of the IC. For example, an ADC with a sampling rate of three giga samples per second and digital logic running at 750 MHz (megahertz) might show interleaving spurs every 750 MHz due to the digital activity. To avoid spurs, the comparatively low frequency digital activity is distributed randomly on high frequency clock edges using randomized, or dithered, clock division. The low frequency clock is generated as a rational factor of the high frequency clock. Where the IC supports multiple high frequency ADC/DAC rates and multiple interface rates, more than one rational factor and associated dithered clock division is required.

SUMMARY

A method for dithering a fractional clock divider includes generating a first clock enable sequence for a clock gate based on a seed pattern of M ones and N minus M zeros, selecting a cyclic rotation of the seed pattern after N clock cycles, and generating a second clock enable sequence for the clock gate based on the cyclic rotation of the seed pattern. A clock gate receives the input clock signal and the clock enable sequences and outputs M clock cycles for every N input clock cycles. In some examples, the cyclic rotation of the seed pattern is chosen by comparing a value of a modulo N counter using a comparator, such that the comparison results in a value of one only once every N input clock cycles, and when the comparison results in a value of one, generating a random number between zero and N minus one. The random number indicates the cyclic rotation of the seed pattern. In some examples, the seed pattern is replaced at infrequent intervals with an updated seed pattern of M ones and N minus M zeros in a different order than the original seed pattern.

In some examples, the clock enable sequences are generated using a cyclic shift register containing the seed pattern and a selector logic circuit, such as a multiplexor, that receives each bit of the cyclic shift register as an input. The selector logic circuit receives a selector signal indicating which input to the selector logic circuit, which bit of the cyclic shift register, to output over the next N input clock cycles. To generate a different clock enable sequence, a new selector signal is sent to the selector logic circuit, indicating a different input to the selector logic circuit, a different bit of the cyclic shift register, to output over the next N input clock cycles. In some examples, the random number from the random number generator serves as the selector signal. In some examples, the clock enable sequences are generated using a kQ modulo N counter and a comparator, such that the result of the comparison is the seed pattern. To generate a difference clock enable sequence, the value of the kQ modulo N counter is overwritten, effecting a cyclic rotation of the seed pattern. In some examples, the random number from the random number generator is overwritten into the kQ modulo N counter.

BRIEF DESCRIPTION OF THE DRAWINGS

For a detailed description of various examples, reference will now be made to the accompanying drawings in which.

DETAILED DESCRIPTION

Figure 1:
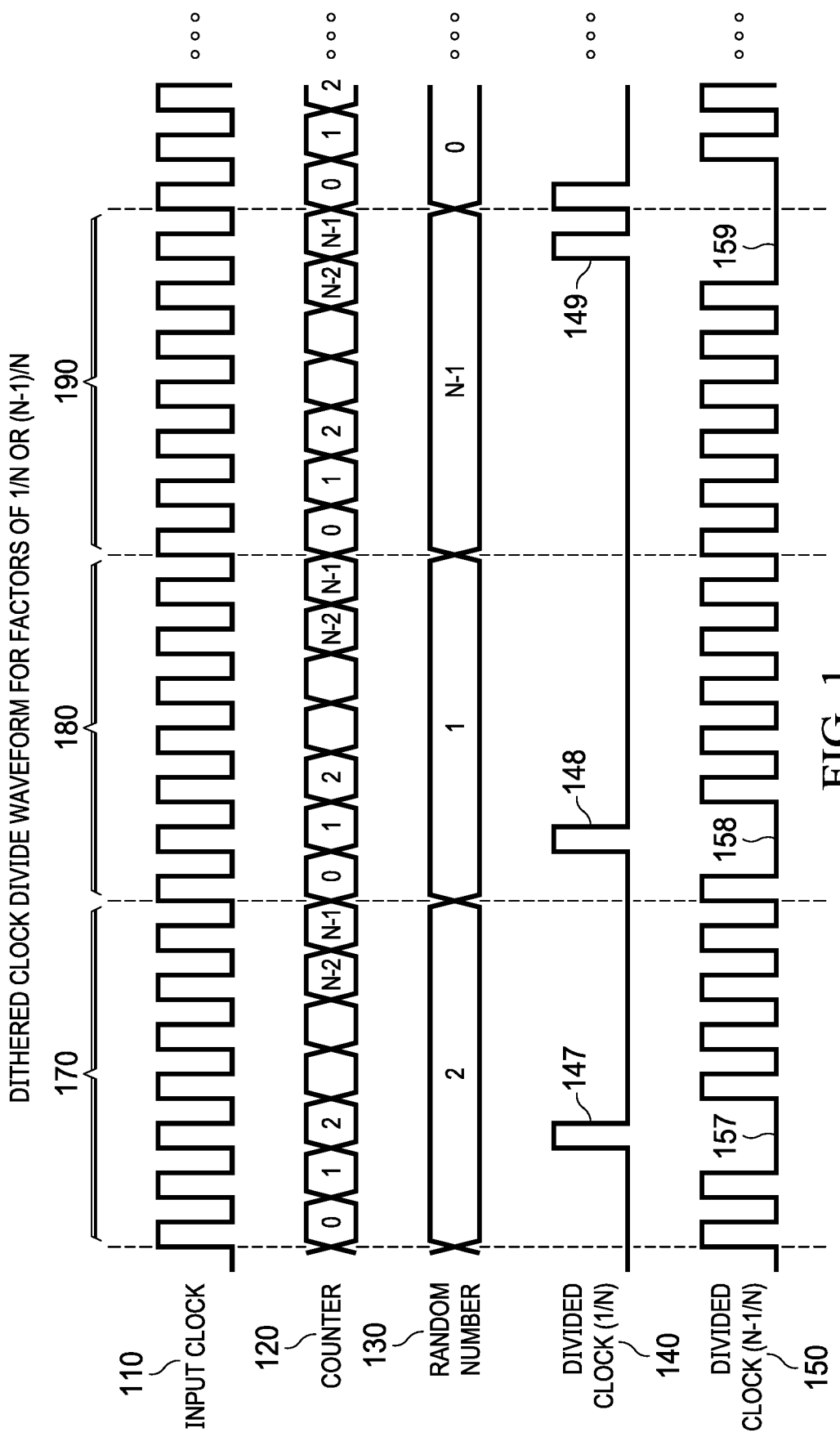
FIG. 1 illustrates an example dithered integer clock divider waveform according to one embodiment.

Described herein is an example clock divider and an example clock enable sequence generator for randomized fractional clock division. Some ICs combine analog and digital circuits and signals, which requires the IC to support multiple sampling rates and by extension, multiple clock frequencies. Some ICs implement multiple clock frequencies using clock dividers, which generate low frequency output clocks from a high frequency input clock. Dithering of the low frequency output clocks distributes the comparatively low frequency digital activity randomly over the high frequency input clock edges, protecting the SFDR of the IC. Some ICs require fractional clock division, e.g., three output clock cycles for every seven input clock cycles. The ratio of output clock cycles to input clock cycles is described as the M/N division factor or M/N ratio. Some M/N ratios, such as 1/N which outputs one clock cycle for every N input clock cycles, is relatively easy to implement and dither. However, other M/N ratios, such as 3/7, are more difficult to dither.

The clock enable sequence generator in the disclosed examples is suitable for implementing any rational M/N division factor and does not require "brute force" dithering, which stores all possible "N choose M" patterns of M ones and N minus M zeros for allowing M out of N clock cycles in a look up table and randomly chooses a pattern to implement every N clock cycles. "Brute force" dithering quickly becomes infeasible for multiple M/N ratios within a single IC, as it requires a separate look up table for each M/N ratio. Similarly, storing all possible patterns of "N choose M" is infeasible for high M/N ratios; for example, an M/N ratio of 16/27 requires a 43 megabyte look up table. Instead, the clock enable sequence generator in the disclosed examples chooses a single "N choose M" pattern and randomly selects one of the N possible cyclic rotations of that single "N choose M" pattern every N clock cycles as the enable sequence for a clock gate. This dithers the output clock signal across the input clock signal and spreads the digital activity uniformly on all the input clock edges, eliminating low frequency clock spurs.

Some clock enable sequence generators use a cyclic shift register loaded with a seed "N choose M" pattern of M ones and N minus M zeros, a selector logic circuit such as a multiplexer (mux), a random number generator, a modulo N counter, and a comparator to divide the input clock by the M/N ratio and dither the resulting output clock. The selector logic circuit uses the values of the seed "N choose M" pattern as the enable signal for a clock gate to allow the input clock signal to pass. The comparator uses an appropriate comparison of the value of the modulo N counter to output a value of one only once every N input clock cycles. The output of the comparator is used to trigger the random number generator to output a random number between zero and N minus one. This random number indicates the cyclic rotation of the seed "N choose M" pattern for use as the enable sequence of the clock gate over the next N input clock cycles.

Other clock enable sequence generators use a kQ modulo N counter, a modulo N counter, two comparators, and a random number generator to divide the input clock by the M/N ratio and dither the resulting output clock. The kQ modulo N counter increments by Q every clock cycle, wrapping around when the count value is greater than or equal to N, and generates a counter sequence that includes all unique values from zero to N minus one, which is ensured when Q is a coprime of N. The first comparator uses an appropriate comparison of the value of the kQ modulo N counter to output M ones and N minus M zeros over N input clock cycles. The output of the first comparator is used as an enable signal for a clock gate such that when the comparator outputs a one, the clock gate is enabled and the input clock is allowed to pass. The second comparator uses an appropriate comparison of the value of the modulo N counter to output a value of one only once every N input clock cycles. The output of the second comparator is used to trigger the random number generator to output a random number between zero and N minus one. The kQ modulo N counter is overwritten with the random number, rotating the "N choose M" pattern output by the first comparator and dithering the output clock signal.

FIG. 1 illustrates an example clock waveform generated using dithered integer division. This example waveform shows an input clock waveform 110, a counter value 120 ranging from zero to N minus one, which increments each input clock cycle, a random number 130 for N clock cycles, and two divided clock waveforms. The first divided clock waveform 140 results from a 1/N clock divider that suppresses N minus one clock cycles and allows one output clock cycle for every N input clock cycles. The second divided clock waveform 150 results from an (N−1)/N clock divider that suppresses one clock cycle and allows N minus one output clock cycles for every N input clock cycles. Both the 1/N clock divider and the (N−1)/N clock divider are dithered by generating a random number between zero and N minus one, for example, using a linear feedback shift register. The random number is compared to counter value 120 for each clock cycle and when the two are the same, the 1/N clock divider allows an output clock cycle and the (N−1)/N clock divider suppresses a clock cycle. Signal spurs are avoided by distributing the low frequency digital activity randomly on high frequency clock edges.

For example, block 170 represents N cycles of input clock 110. Counter value 120 cycles through zero to N minus one over the course of those N cycles. The linear feedback shift register output 130 in block 170 is two. Divided clock 140 compares counter value 120 for each input clock 110 cycle to the random number 130. Until the two are equal, divided clock 140 suppresses all clock cycles. When counter value 120 is two, it is equal to the random number 130 and divided clock 140 allows a clock cycle as shown at 147. Divided clock 150 also compares counter value 120 for each input clock 110 cycle to the random number 130. Until the two are equal, divided clock 150 allows all clock cycles.

When counter value 120 is two, it is equal to the random number 130 and divided clock 150 suppresses a clock cycle, as shown at 157. In block 180, a random number generator, such as a linear feedback shift register outputs a new value for random number 130: one. Counter value 120 restarts at zero and cycles through the values zero to N minus one again over the course of the next N cycles of input clock 110. Divided clock 140 suppresses all clock cycles except when counter 120 reaches one, when it allows a clock cycle as shown at 148. Divided clock 150 allows all clock cycles except when counter 120 reaches one, when it suppresses a clock cycle as shown at 158. However, dithering in this manner is only effective for some M/N ratios and cannot be relied upon to dither every fractional output clock required by an IC.

Figure 2A:
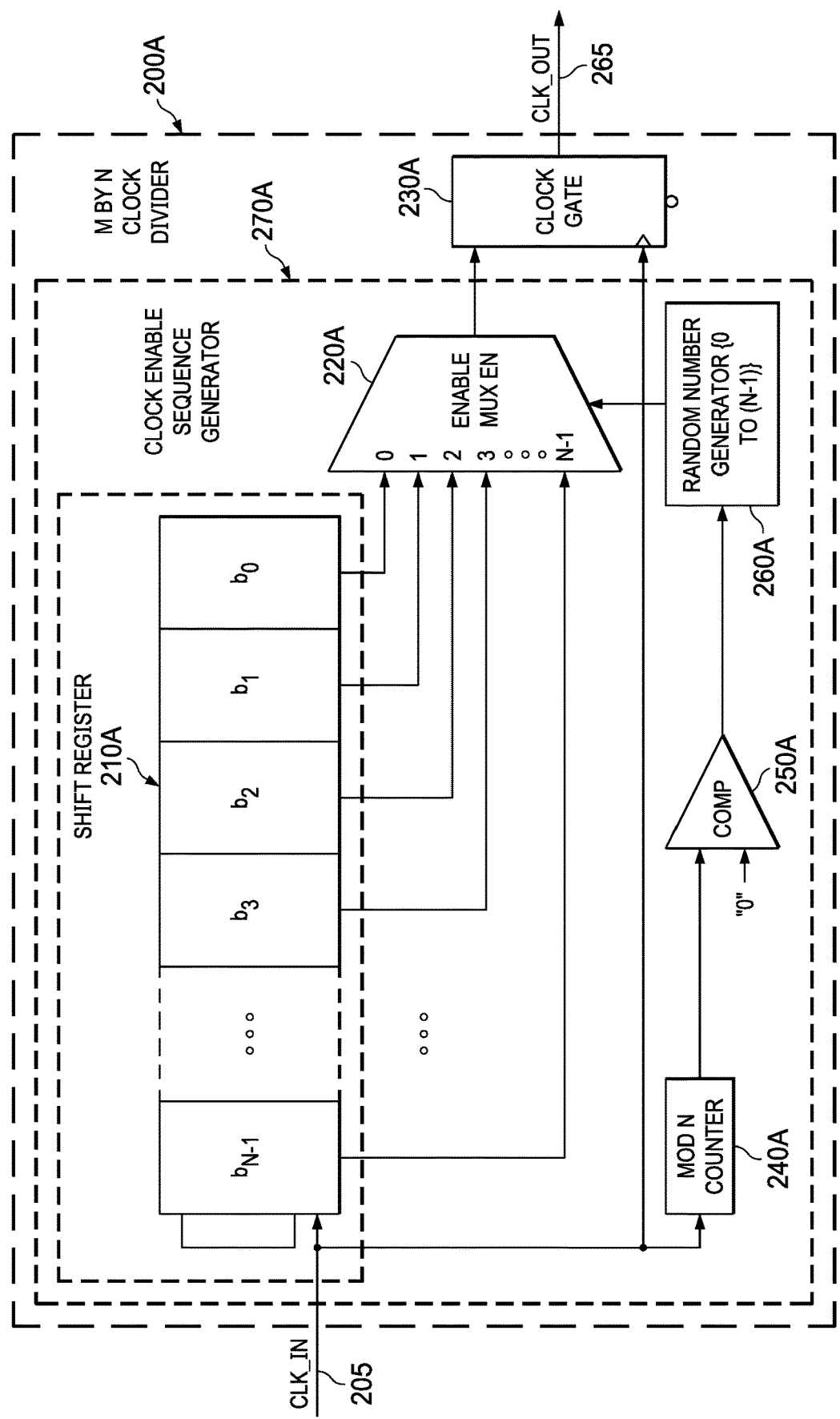
FIGS. 2A-B illustrate an example dithered M by N clock divider with an example clock enable sequence generator according to one embodiment.

FIG. 2A illustrates an example M by N clock divider 200A with an example clock enable sequence generator 270A for use in dithered M by N clock division. In this example, M is three and N is seven, such that the M/N ratio is 3/7 meaning that for every seven input clock cycles, three clock cycles are output by clock divider 200A. Clock divider 200A includes clock enable sequence generator 270A and clock gate 230A. Clock gate 230A can be any appropriate clock gating mechanism, such as an AND gate or an integrated clock gating cell including an AND gate and a latch. Clock gate 230A receives input clock 205 and an enable sequence from clock enable sequence generator 270A. Clock enable sequence generator 270A includes an N-bit cyclic shift register 210A loaded with a seed "N choose M" pattern of M ones and N minus M zeros, an enable mux 220A with N inputs and one output, a modulo N counter 240A, a comparator 250A, and a random number generator 260A. The seed "N choose M" pattern of M ones and N minus M zeros loaded in cyclic shift register 210A in this example is [1 0 0 1 0 1 0], which allows the first, fourth, and sixth input clock cycles 205 to be output from the clock divider as dithered output clock 265. The seed pattern [1 0 0 1 0 1 0] is loaded into cyclic shift register 210A as [b0 b1 b2 b3 b4 b5 b6] into the first seven bits of the shift register.

Each bit of cyclic shift register 210A is coupled to enable mux 220A as an input. Clock enable sequence generator 270A uses the enable mux 220A to implement rotations of the seed pattern stored in cyclic shift register 210A, but any appropriate selector logic can be used. The output of enable mux 220A is used as the enable signal for clock gate 230A. For example, enable mux 220A selects the first bit of cyclic shift register 210A, b0, as its output and cyclic shift register 210A rotates each value of the seed pattern [1 0 0 1 0 1 0] through b0 of the cyclic shift register to serve as the enable signal for clock gate 230A for the next N input clock cycles. Clock gate 230A allows the first, fourth, and sixth input clock cycles 205 to be output from clock divider 200A as dithered output clock 265.

To randomize the enable signal for clock gate 230A and dither the output clock signal 265, modulo N counter 240A counts N clock cycles before wrapping around to zero. The value of modulo N counter 240A is compared to zero using comparator 250A. Comparator 250A is a digital comparator that compares the value of modulo N counter 240A to zero, but any appropriate comparison that results in comparator 250A triggering random number generator 260A after every N clock cycles may be used, such as equal to one or greater than N minus two, for example. When the value of modulo N counter 240A is equal to zero, random number generator 260A generates a random number between zero and N minus one. Random number generator 260A can be any appropriate random or pseudorandom number generator, such as a random number generator using a linear feedback shift register (LFSR) followed by multiplication and rounding, for example.

The random number is input as a selection signal to enable mux 220A to indicate which bit of cyclic shift register 210A should be used as the enable signal for the next N clock cycles to implement one of the N possible rotations of the seed pattern. For example, the random number is one so the seed pattern [1 0 0 1 0 1 0] is rotated by one bit, such that the second bit, zero, becomes the first bit, etc., and the seventh bit, zero, becomes the sixth bit. The first bit, one, wraps around and becomes the seventh bit, resulting in a rotated seed pattern of [0 0 1 0 1 0 1]. To implement the rotated seed pattern and the random number selection signal, enable mux 220A selects the second input, the second bit b1 of cyclic shift register 210A, to output as the enable signal for the clock gate. In another example, the random number is six so the seed pattern [1 0 0 1 0 1 0] is rotated by six bits, such that the seventh bit, zero, becomes the first bit and the first bit, one, becomes the second bit, etc., resulting in a rotated seed pattern of [0 1 0 0 1 0 1]. To implement the rotated seed pattern and the random number selection signal, enable mux 220A selects the seventh input, the seventh bit b6 of cyclic shift register 210A, to output as the enable signal for the clock gate.

Figure 2B:
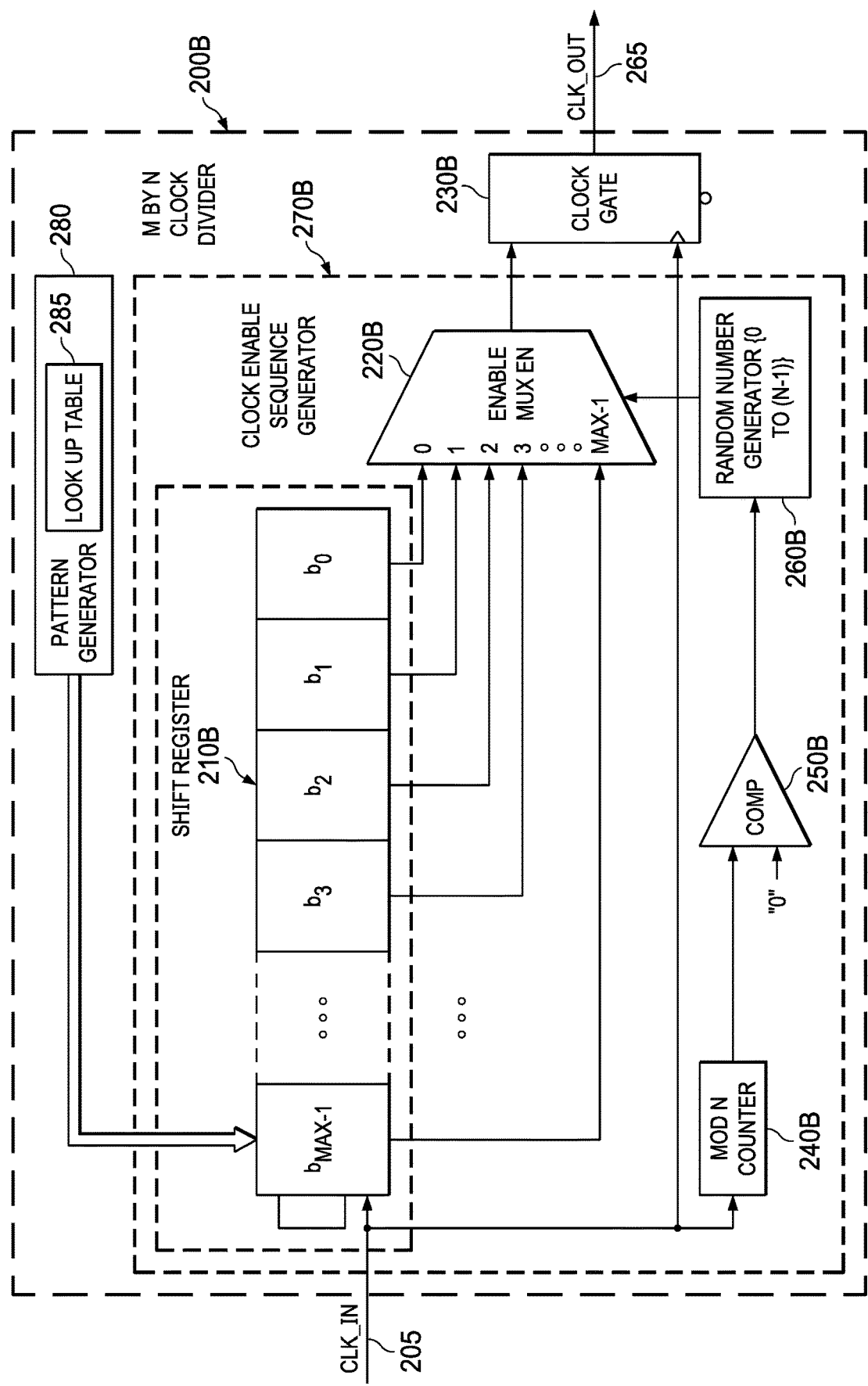

Clock enable sequence generator 270A and clock divider 200A can be adapted to any M/N ratio, as illustrated in FIG. 2B by example reconfigurable M by N clock divider 200B. Reconfigurable clock divider 200B functions largely the same as clock divider 200A, and includes clock enable sequence generator 270B and clock gate 230B. Clock enable sequence generator 270B includes a variable length cyclic shift register 210B with a maximum bit length of MAX, an enable mux 220B with MAX inputs and one output, a variable modulo counter 240B, a comparator 250B, and a random number generator 260B.

To adapt to any values of M and N less than or equal to MAX, variable length cyclic shift register 210B adjusts to the appropriate length N using shift register shortening and is loaded with a seed "N choose M" pattern of M ones and N minus M zeros. In some examples, variable length cyclic shift register 210B includes a multiplexor or other selector logic circuit between every two consecutive shift register elements, which chooses between the bit stored in the previous shift register element and the bit stored in the "wrap around" shift register element. For example, in cyclic shift register 210A, the multiplexors between every two consecutive shift register elements would select between the bit stored in the previous shift register element and the bit stored in the b0 shift register element. The length of variable length shift register 210B is changed by instructing the multiplexor between the N minus one shift register element and the N shift register element to output the bit stored in the "wrap around" shift register element instead of the bit stored in the N shift register element.

Variable modulo counter 240B adjusts to the appropriate value of N by updating a programmable comparator used to determine the wrap-around point of the counter. Random number generator 260B updates its range to zero through N minus one. In some examples, random number generator 260B incorporates an LFSR, an integer multiplier, and rounding logic to generate uniform random numbers between zero and any integer N minus one. The range of random numbers can be updated by changing the output multiplication factor. Enable mux 220B remains the same, with MAX inputs and one output. Reconfigurable clock divider 200B then functions as clock divider 200A does to generate a dithered output clock signal 265.

To adapt to an updated M/updated N ratio, variable length cyclic shift register 210B adjusts to the updated length N using shift register shortening as described above and is loaded with a seed "updated N choose updated M" pattern of updated M ones and updated N minus updated M zeros. In some ICs, variable length cyclic shift register 210B is loaded by pattern generator 280. Pattern generator 280 can include a look up table 285 containing a plurality of seed patterns to accommodate a variety of M/N ratios, including the original M/N and updated M/updated N ratios. Pattern generator 280 includes look up table 285, but the new seed pattern may be generated by any appropriate means. The number of seed patterns stored in look up table 285 can be chosen to accommodate the M/N ratios required by the IC. Variable modulo counter 240B adjusts to the value of updated N and random number generator 260B updates its range to zero through updated N minus one as described above. Reconfigurable clock divider 200B then functions as clock divider 200A does to generate a dithered output clock signal 265 at the updated M/updated N ratio. Reconfigurable clock divider 200B allows the same clock divider to be used for multiple M/N ratios, reducing the number of clock dividers necessary to fulfill the IC's clock division requirements.

In some ICs, pattern generator 280 loads an updated seed pattern of the current M/N ratio into variable length cyclic shift register 210B at random intervals, without the need for adjustment to a new value of M or N. Replacing the seed pattern at random intervals further improves the randomization of the output clock signal over the high frequency clock edges. For example, for the M/N ratio of 3/7, different seed patterns include [1 0 0 1 0 1 0], [1 1 1 0 0 0 0], etc. These seed patterns include three ones and four zeros, but are not rotated versions of the same base seed pattern. The seed patterns stored in the look up table can be chosen based on the desired flatness of the resulting spectrum of the dithered output clock. For example, the resultant spectrum can be flatter where the look up table includes patterns in which the ones are spread apart approximately equally through the seed pattern and patterns in which the ones are clustered together within the seed pattern. The number of seed patterns stored in the look up table for each M/N ratio can be chosen to balance the need for new seed patterns to improve the flatness of the final spectrum of the dithered clock and the resulting total size of the look up table and speed with which the seed patterns can be found in the look up table to replace the current seed pattern in variable length cyclic shift register 210B. The random intervals after which the pattern generator 280 replaces the current seed pattern with a new seed pattern can be chosen based on the particular application for the IC.

Figure 3:
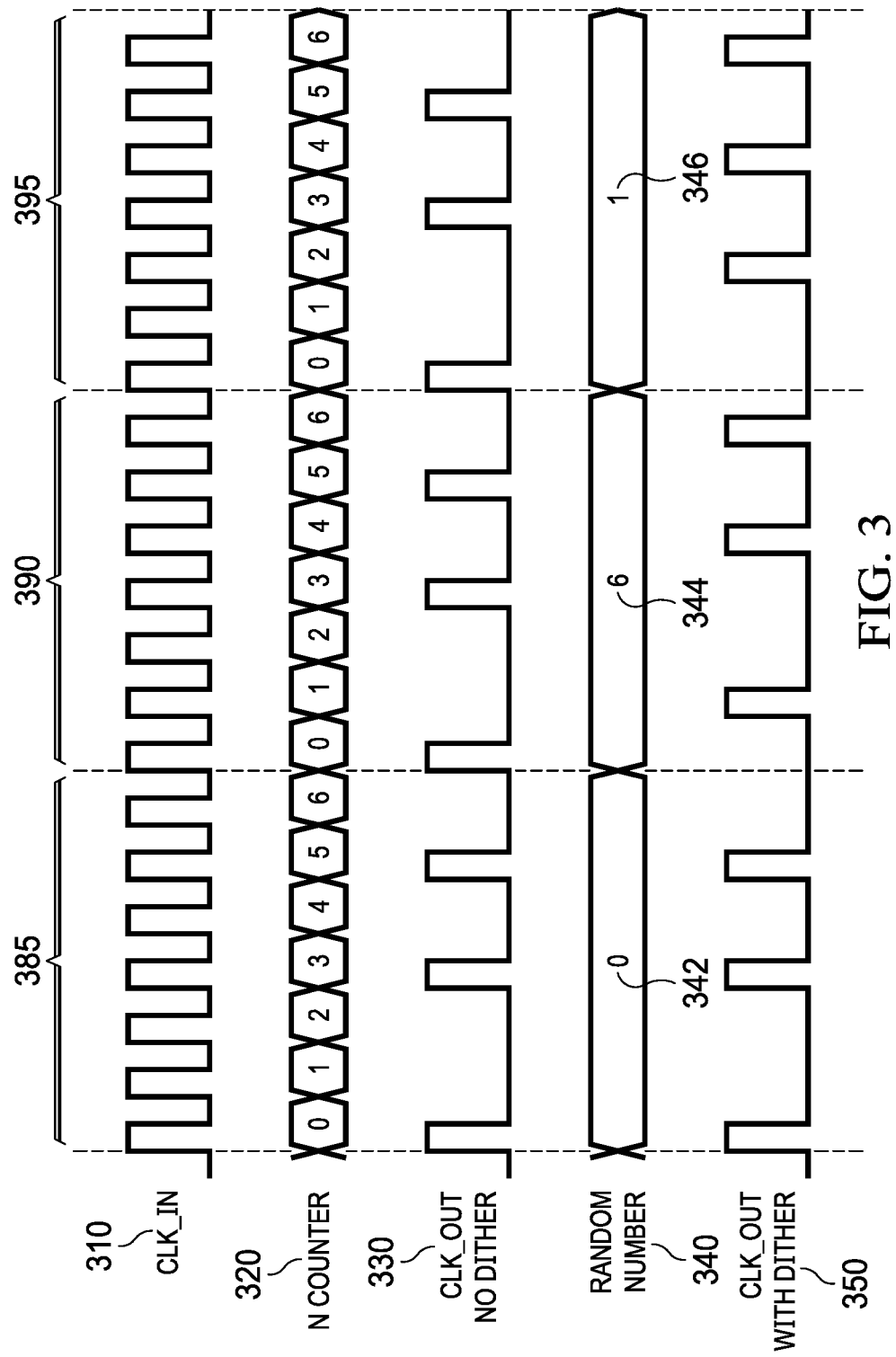
FIG. 3 illustrates an example dithered M by N clock divider waveform according to one embodiment.

FIG. 3 illustrates example values of components within M by N clock divider 200A over time. As described previously, clock divider 200A implements an M/N ratio of 3/7, meaning that for every seven input clock cycles, three clock cycles are output by clock divider 200A. The example values shown in FIG. 3 include an input clock 310, a counter value 320 ranging from zero to N minus one from modulo N counter 240A, an output clock 330 without dithering, a random number value 340 from random number generator 260A, and an output clock 350 with dithering from clock gate 230A. Blocks 385, 390, and 395 each represent N cycles of input clock 310. In block 385, the random number value 342 generated by random number generator 260A is zero and the seed pattern [1 0 0 1 0 1 0] serves as the enable sequence for clock gate 230A, such that both the output clock 330 without dithering and output clock 350 with dithering show output clock cycles corresponding to the first, fourth, and sixth input clock cycles 310. Output clock 330 without dithering repeats this seed pattern and the low frequency digital activity on the same high frequency clock edges of input clock 310 for each of blocks 385, 390, and 395, allowing signal spurs and compromising the spurious free dynamic range of the IC.

In contrast, output clock 350 with dithering randomizes which input clock cycles 310 correspond to output clock cycles. For example, in block 390, the counter value 320 from modulo N counter 240A wraps around to zero and comparator 250A triggers random number generator 260A to generate a new random number 340. In block 390, the random number value 344 from random number generator 260A is six, rotating the seed pattern [1 0 0 1 0 1 0] by six bits and resulting in a rotated seed pattern of [0 1 0 0 1 0 1]. Enable mux 220A selects the seventh input, the seventh bit b6 of cyclic shift register 210A, to output as the enable sequence for clock gate 230A and output clock 350 with dithering shows output clock cycles corresponding to the second, fifth, and seventh input clock cycles 310 of block 390.

In block 395, the counter value 320 from modulo N counter 240A wraps around to zero and comparator 250A triggers random number generator 260A to generate a new random number 340. In block 395, the random number value 346 from random number generator 260A is one, rotating the seed pattern [1 0 0 1 0 1 0] by one bit and resulting in a rotated seed pattern of [0 0 1 0 1 0 1]. Enable mux 220A selects the second input, the second bit b1 of cyclic shift register 210A, to output as the enable sequence for clock gate 230A and output clock 350 with dithering shows output clock cycles corresponding to the third, fifth, and seventh input clock cycles 310 of block 395. Output clock 350 implements a randomized rotation of the seed pattern [1 0 0 1 0 1 0] every N input clock cycles 310, such that the output clock cycles 350 correspond to different input clock cycles 310 in each of blocks 385, 390, and 395. This randomized distribution of the output clock cycles 350 and the low frequency digital activity on high frequency clock edges by M by N clock divider 200A reduces the likelihood of signal spurs and protects the spurious free dynamic range of the IC.

Figure 4A:
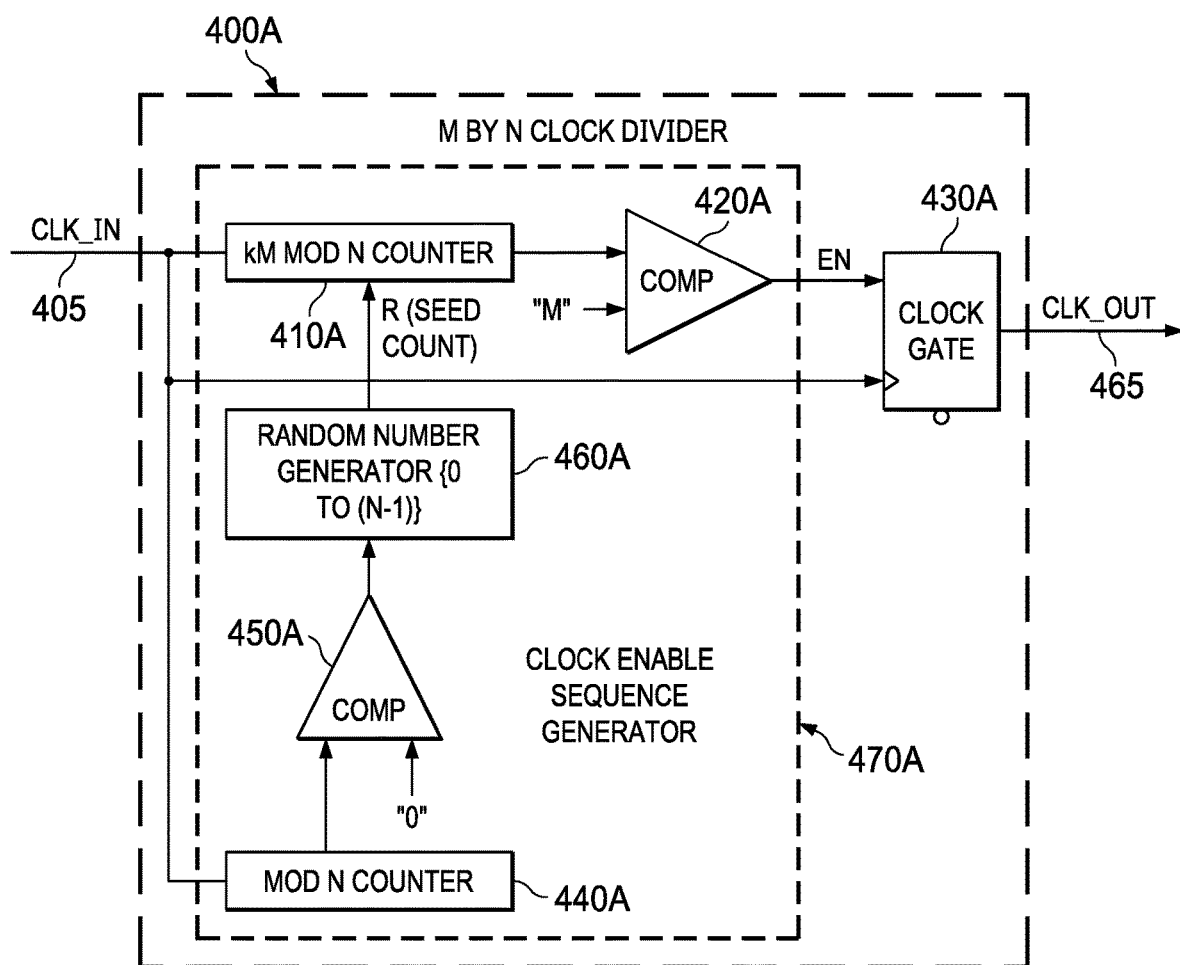
FIGS. 4A-B illustrate an example dithered M by N clock divider with an example clock enable sequence generator according to one embodiment.

FIG. 4A illustrates an example M by N clock divider 400A with an example clock enable sequence generator 470A for use in dithered M by N clock division. In this example, M is three and N is seven, such that the M/N ratio is 3/7 and for every seven input clock cycles, three clock cycles are output by clock divider 400A. Clock divider 400A includes clock enable sequence generator 470A and clock gate 430A. Clock gate 430A can be any appropriate clock gating mechanism, such as an AND gate or an integrated clock gating cell including an AND gate and a latch. Clock gate 430A receives input clock 405 as the input and receives an enable sequence from clock enable sequence generator 470A. Clock enable sequence generator 470A includes a kM modulo N counter 410A, a comparator 420A, a modulo N counter 440A, a comparator 450A, and a random number generator 460A. kM modulo N counter 410A increments by M every clock cycle, wrapping around when the counter value is greater than N minus one and generating a permuted sequence of values from zero to N minus one.

For example, here M is three and N is seven, so kM modulo N counter 410A shows a sequence of [0 3 6 2 5 1 4] over the first N input clock cycles 405. Comparator 420A is a digital comparator that compares the current value of kM modulo N counter 410A to M such that when the current value of kM modulo N counter 410A is less than M, comparator 420A outputs a one. When the current value of kM modulo N counter 410A is greater than or equal to M, comparator 420A outputs a zero. The output of comparator 420A is used as the enable signal for clock gate 430A. For example, where kM modulo N counter 410A shows a sequence of [0 3 6 2 5 1 4] over N input clock cycles 405, the output of comparator 420A and enable signal for clock gate 430A is [1 0 0 1 0 1 0]. Clock gate 430A allows the first, fourth, and sixth input clock cycles 405 to be output from clock divider 400A as output clock 465.

To randomize the enable signal for clock gate 430A and dither output clock signal 465, modulo N counter 440A counts N clock cycles before wrapping around to zero. The value of modulo N counter 440A is compared to zero using comparator 450A. Comparator 450A is a digital comparator and compares the value of modulo N counter 440A to zero, but any appropriate comparison that results in comparator 450A triggering random number generator 460A after every N clock cycles may be used, such as equal to one or greater than N minus two, for example. When the value of modulo N counter 440A is equal to zero, random number generator 460A generates a random number between zero and N minus one. Random number generator 460A can be any appropriate random or pseudorandom number generator, such as a random number generator using a linear feedback shift register followed by multiplication and rounding, for example.

The random number generated by random number generator 460A is used to overwrite the current value of kM modulo N counter 410A and restart the kM modulo N sequence at a new seed value. For example, the random number generated by random number generator 460A is six, so the kM modulo N sequence [0 3 6 2 5 1 4] becomes [6 2 5 1 4 0 3], which in turn leads the output of comparator 420A and enable signal for clock gate 430A to be [0 1 0 1 0 1 0]. Clock gate 430A allows the second, fourth, and sixth input clock cycles 405 to be output from clock divider 400A as output clock 465. In another example, the random number generated by random number generator 460A is three, so the kM modulo N sequence [0 3 6 2 5 1 4] becomes [3 6 2 5 1 4 0], which in turn leads the output of comparator 420A and enable signal for clock gate 430A to be [0 0 1 0 1 0 1]. Clock gate 430A then allows the third, fifth, and seventh input clock cycles 405 to be output from clock divider 400A as output clock 465.

Clock enable sequence generator 470A uses comparator 420A to determine if the value of kM modulo N counter 410A is less than M, but any appropriate comparison that results in comparator 420A outputting M ones and N minus M zeros may be used. For example, comparator 420A may instead determine if the value of kM modulo N counter 410A is greater than M. In this example, the kM modulo N counter 410A sequence [0 3 6 2 5 1 4] over N input clock cycles 405 prompts the output of comparator 420A and enable signal for clock gate 430A to be [0 0 1 0 1 0 1]. Clock gate 430A allows the third, fifth, and seventh input clock cycles 405 to be output from clock divider 400A as output clock 465. Note that the greater than M comparison used here is effective because (N−1)−M=M, or (7−1)−3=3. The greater than M comparison may not be appropriate for all values of M and N. A greater than or equal to N minus M comparison will work for any values of M and N. In some examples, the comparator compares the value of the counter against a look-up table of any M unique count values out of N values.

Figure 4B:
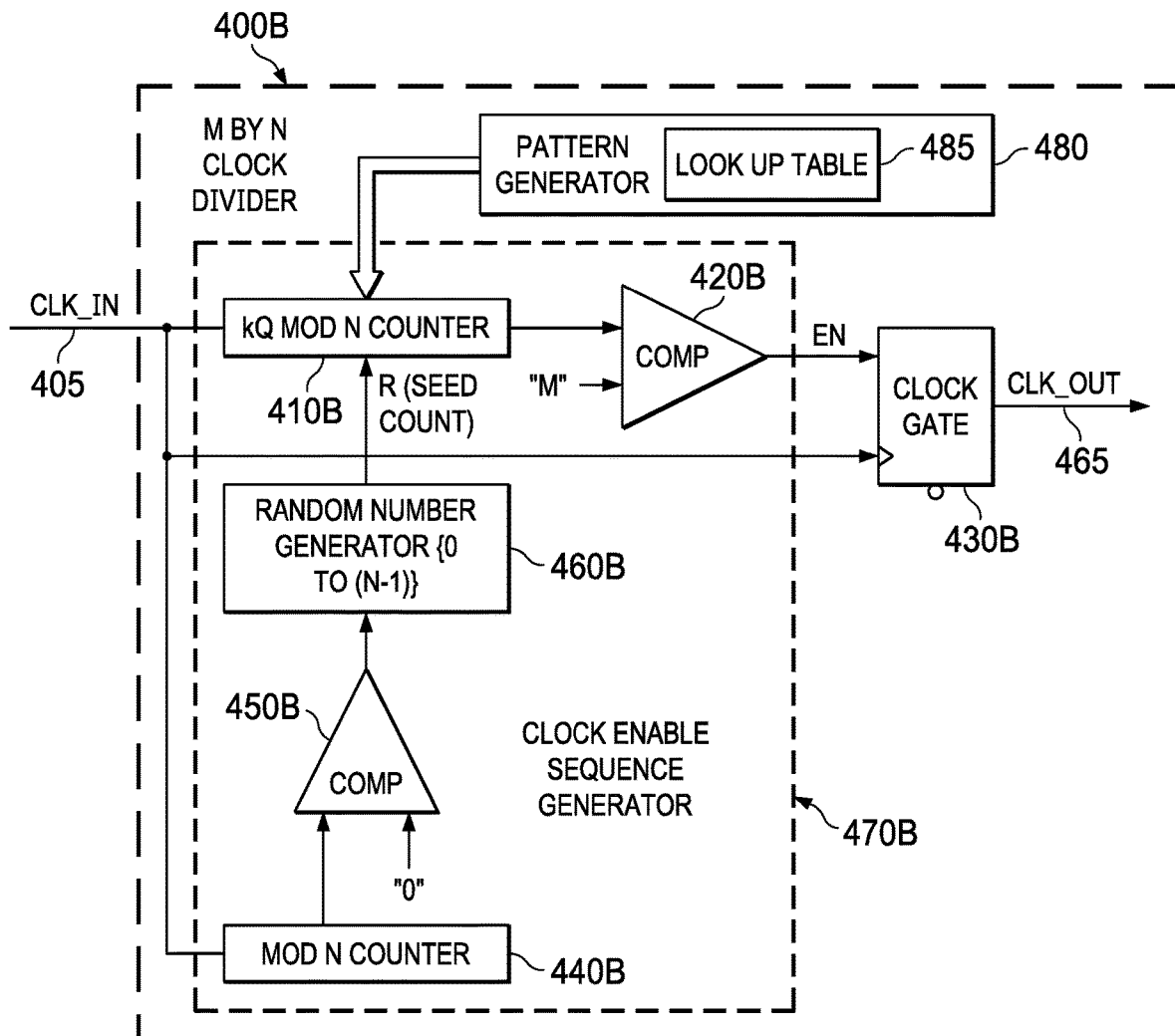

Clock enable sequence generator 470A and clock divider 400A can be adapted to any M/N ratio, as illustrated in FIG. 4B by reconfigurable clock divider 400B. Reconfigurable clock divider 400B functions largely the same as clock divider 400A, and includes clock enable sequence generator 470B and clock gate 430B. Clock enable sequence generator 470B includes a variable kQ modulo N counter 410B, a comparator 420B, a variable modulo counter 440B, a comparator 450B, and a random number generator 460B. Variable kQ modulo N counter 410B increments by Q every clock cycle, generating a permuted sequence of values from zero to N minus one. Any value of Q may be used as long as the counter sequence includes all unique values from zero to N minus one, which is ensured when Q is a coprime of N.

Two numbers are coprime if the only positive integer that divides both of them is one. kM modulo N counter 410A works effectively for clock sequence generator 470A because M, three, and N, seven, are coprimes. As another example, Q is five and N remains seven. Because five and seven are coprimes, the variable kQ modulo N counter 410B shows a sequence of [0 5 3 1 6 4 2], which includes all unique values from zero to N minus one, six. The kQ modulo N counter sequence [0 5 3 1 6 4 2] prompts the output of comparator 420B and enable signal for clock gate 430B to be [1 0 0 1 0 0 1] and clock gate 430B allows the first, fourth, and seventh input clock cycles 405 to be output as dithered output clock 465. A Q value of one is appropriate for any value of N and causes the variable kQ modulo N counter 410B to show the non-permuted sequence [0 1 2 . . . N−1].

The kM modulo N counter 410A generates a permuted sequence of all integers between zero and N minus one because M and N are coprime. For a pair of numbers M2 and N2 that are not themselves coprimes but can be reduced to a set of coprimes M and N, e.g. M2/N2=(RM)/(RN), the sequence generated by a kM2 modulo N2 counter is periodic over N, not N2, and each value in the sequence for M2 and N2 is R times the corresponding value in the sequence for M and N. Using comparator 420B to compare the M2/N2 sequence to M2, R times M, gives the same output signal as the comparison of the M/N sequence to M. Thus, reconfigurable clock divider 400B can be adapted to accommodate such pairs of numbers, but will generate the same sequence for M2 and N2 as for M and N.

To adapt to any value of N and M, variable kQ modulo N counter 410B adjusts to the appropriate value of N and an appropriate Q value is implemented. In some examples, variable kQ modulo N counter 410B uses a programmable comparator to determine the wrap-around point of the counter. The wrap-around point and the comparison can be changed to accommodate any value of N. Comparator 420B is adapted to ensure the comparison results in M ones and N minus M zeros. Variable modulo counter 440B adjusts to the appropriate value of N. In some examples, variable modulo N counter 440B uses a comparator to determine the wrap-around point of the counter, which can be programmed to accommodate any value of N.

Random number generator 460B updates its range to zero through N minus one. In some examples, random number generator 460B incorporates an LFSR, an integer multiplier, and rounding logic to generate uniform random numbers between zero and any integer N minus one. The range of random numbers can be updated by changing the output multiplication factor. Reconfigurable clock divider 400B then functions as clock divider 400A does to generate a dithered output clock signal 465. To adapt to an updated M/updated N ratio, variable kQ modulo N counter 4106 adjusts to the value of updated N and an appropriate Q value is implemented.

In some ICs, an appropriate Q value is selected by pattern generator 480. Pattern generator 480 can include a look up table 485 containing a plurality of values for N and associated coprime Qs for each value of N. The number of values for N and the number of associated coprime Qs for each value of N can be chosen to accommodate the M/N ratios required by the IC. Pattern generator 480 includes look up table 485, but any appropriate means of generating a coprime of N may be used, such as a random or pseudo-random number generator selecting from a set of coprimes of N. Comparator 420B is adapted to ensure the comparison results in updated M ones and updated N minus updated M zeros and variable modulo counter 440B adjusts to the appropriate value of N. Random number generator 460B updates its range to zero through updated N minus one. Reconfigurable clock divider 400B then functions as clock divider 400A does to generate a dithered output clock signal 465 at the updated M/updated N ratio.

Reconfigurable clock divider 400B allows the same clock divider to be used for multiple M/N ratios, reducing the number of clock dividers necessary to fulfill the IC's clock division requirements. In some ICs, pattern generator 480 also selects an updated Q value for variable kQ modulo N counter 410B to implement at random intervals, without the need for adjustment to a new value of M or N. Replacing the value of Q at random intervals further improves the randomization of the output clock signal over the high frequency clock edges. The random intervals after which the value of Q for the kQ modulo N counter is changed can be chosen based on the particular application for the IC and the number of coprimes for a particular N value.

Figure 5:
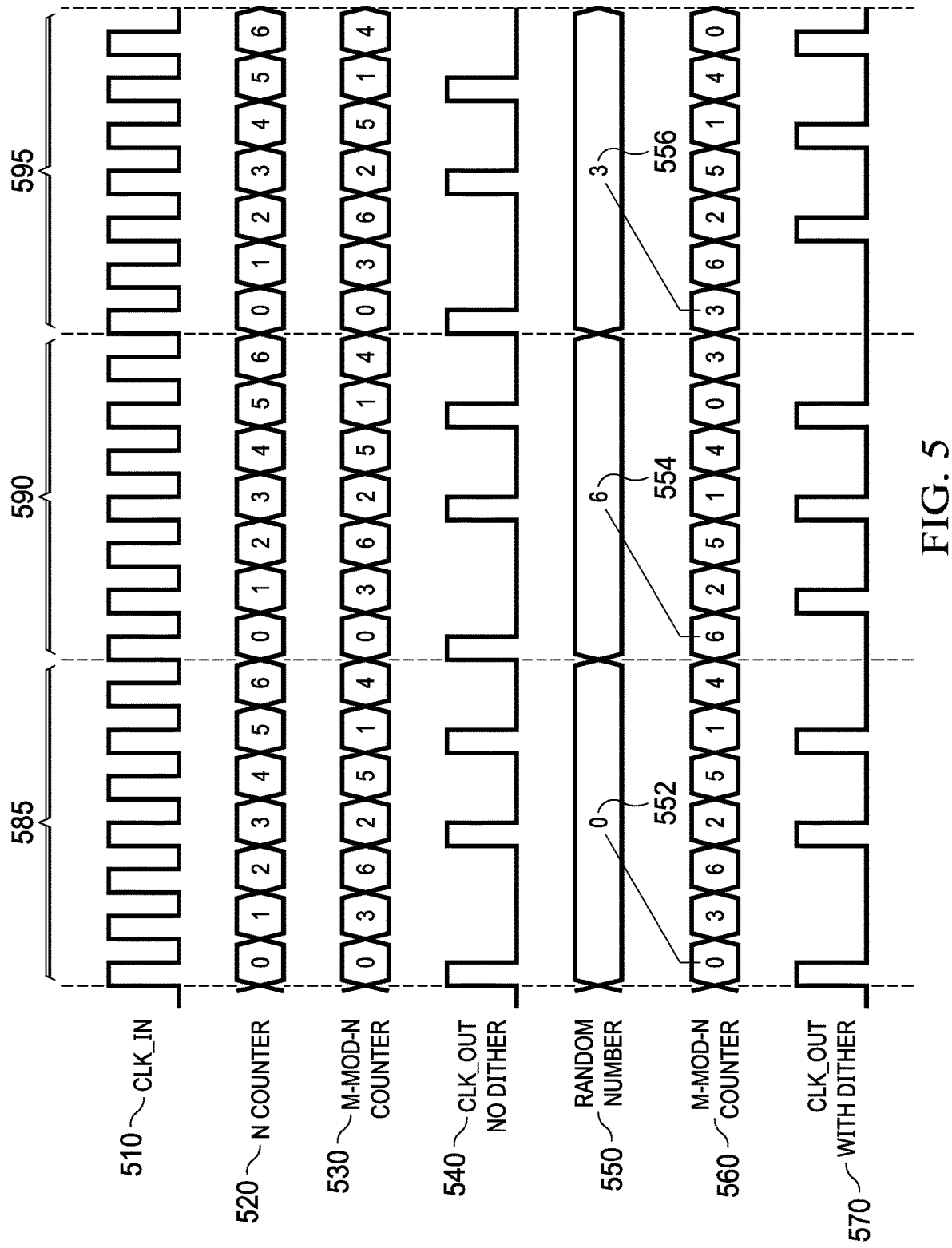
FIG. 5 illustrates an example dithered M by N clock divider waveform according to one embodiment.

FIG. 5 illustrates example values of components within M by N clock divider 400A over time. As described previously, clock divider 400A implements an M/N ratio of 3/7, meaning that for every seven input clock cycles, three clock cycles are output by clock divider 400A. The example values shown include input clock 510, a counter value 520 for each input clock cycle 510 ranging from zero to N minus one from modulo N counter 440A, a counter value 530 for each input clock cycle 510 ranging from zero to N minus one from an M modulo N counter without random number overwriting, an output clock 540 without dithering, a random number value 550 from random number generator 460A, a counter value 560 for each input clock cycle 510 ranging from zero to N minus one from kM modulo N counter 410A, and an output clock 570 with dithering from clock gate 430A. Blocks 585, 590, and 595 each represent N cycles of input clock 510.

In block 585, the random number value 552 generated by random number generator 460A is zero so the counter value 560 from kM modulo N counter 410A is the same sequence as counter value 530 from the M modulo N counter without random number overwriting: [0 3 6 2 5 1 4]. Both result in an enable sequence of [1 0 0 1 0 1 0] for clock gate 430A and both output clock 540 without dithering and output clock 570 with dithering show output clock cycles corresponding to the first, fourth, and sixth input clock cycles 510. In blocks 590 and 595, counter value 530 from the M modulo N counter without random number overwriting repeats the same sequence [0 3 6 2 5 1 4] and leads to the same pattern of output clock cycles in output clock 540 without dithering. This puts the low frequency digital activity on the same high frequency clock edges of input clock 510 for each of blocks 585, 590, and 595, allowing signal spurs on those clock edges and compromising the spurious free dynamic range of the IC.

In contrast, output clock 570 randomizes which input clock cycles 510 correspond to output clock cycles. For example, in block 590, the N counter value 520 wraps around to zero and comparator 450A triggers random number generator 460A to generate a new random number 554, six. Counter value 560 from kM modulo N counter 410A is rewritten to random number 554, which rotates the M modulo N sequence [0 3 6 2 5 1 4] to [6 2 5 1 4 0 3]. This leads output clock 570 with dithering to show output clock cycles corresponding to the second, fourth, and sixth input clock cycles 510 of block 590. In block 595, N counter value 520 from modulo N counter 440A wraps around to zero and comparator 450A triggers random number generator 460A to generate a new random number 556, three. Counter value 560 from kM modulo N counter 410A is rewritten to random number 556, which rotates the M modulo N sequence [0 3 6 2 5 1 4] to [3 6 2 5 1 4 0]. This leads output clock 570 with dithering to show output clock cycles corresponding to the third, fifth, and seventh clock cycles 510 of block 590. Output clock 570 with dithering implements a randomized rotation of the M modulo N sequence [0 3 6 2 5 1 4] every N input clock cycles 510, such that the output clock cycles 570 correspond to different input clock cycles 510 in each block of N input clock cycles, such as blocks 585, 590, and 595. This randomized distribution of the output clock cycles 570 and the low frequency digital activity on high frequency clock edges by M by N clock divider 400A reduces the likelihood of signal spurs and protects the spurious free dynamic range of the IC.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A fractional clock divider comprising:
    a kQ modulo N counter having inputs to receive an input clock signal and an overwrite signal, the kQ modulo N counter also having an output;
    a first comparator having an input to receive the kQ modulo N counter output, the first comparator also having an output to provide a clock enable sequence, wherein over N input clock cycles, the first comparator is to output a value of one for M of the N input clock cycles and a value of zero for a remainder of the N input clock cycles;
    a clock gate having inputs to receive the input clock signal and the clock enable sequence, the clock gate also having an output to provide a divided clock signal;
    a modulo N counter, having an input to receive the input clock signal, the modulo N counter also having an output;
    a second comparator having an input to receive the modulo N counter output, the second comparator also having an output, wherein over N input clock cycles, the second comparator is to output a value of one for one input clock cycle and a value of zero for a remainder of the N input clock cycles; and
    a random number generator having an input to receive the second comparator output, the random number generator also having an output to provide the overwrite signal, wherein the random number generator is to output a number between zero and N minus one.

2. The fractional clock divider of claim 1, wherein the random number generator comprises a linear feedback shift register.

3. The fractional clock divider of claim 1, further comprising:
    a pattern generator configured to generate an updated Q for the kQ modulo N counter, the updated Q comprising a coprime of N.

4. The fractional clock divider of claim 3, wherein the pattern generator comprises a look up table, the look up table comprising one or more sets of Q values, each set of Q values associated with a unique N value and each Q value in each set of Q values comprising a coprime of the associated unique N value.

5. The fractional clock divider of claim 1, wherein M, N, and Q are programmable.

6. The fractional clock divider of claim 1, wherein the kQ modulo N counter increments by Q and the kQ modulo N counter output comprises a permuted sequence of every value between zero and N minus one.

* * * * *